United States Patent [19]
Ferraiolo et al.

[11] Patent Number: 5,757,238
[45] Date of Patent: May 26, 1998

[54] FAST LOCKING VARIABLE FREQUENCY PHASE-LOCKED LOOP

[75] Inventors: Frank David Ferraiolo, Essex Junction; John Edwin Gersbach, Burlington; Charles Joseph Masenas, Essex Junction, all of Vt.

[73] Assignee: International Business Machines Corporation, Armonk, N.Y.

[21] Appl. No.: 699,296

[22] Filed: Aug. 19, 1996

[51] Int. Cl.$^6$ .................................................. H03L 7/18
[52] U.S. Cl. ............................ 331/16; 331/17; 331/18; 331/57; 327/105; 327/156; 327/157; 360/51; 455/260
[58] Field of Search .......................... 331/1 A, 15, 16, 331/17, 18, 25, 57; 327/105, 156–159; 455/260; 360/51

[56] References Cited

U.S. PATENT DOCUMENTS

| | | | |
|---|---|---|---|
| 4,568,888 | 2/1986 | Kimura et al. | 331/61 X |
| 4,926,141 | 5/1990 | Herold et al. | 331/16 |
| 5,036,216 | 7/1991 | Hohmann et al. | 309/269 |
| 5,128,632 | 7/1992 | Erhart et al. | 331/16 X |
| 5,142,247 | 8/1992 | Lada, Jr. et al. | 331/14 |
| 5,334,952 | 8/1994 | Maddy et al. | 331/16 X |
| 5,349,309 | 9/1994 | Fujii | 331/1 A X |
| 5,349,544 | 9/1994 | Wright et al. | 364/600 |
| 5,355,527 | 10/1994 | Owaki | 455/186.2 |
| 5,406,229 | 4/1995 | Kojima | 331/14 |
| 5,451,912 | 9/1995 | Torode | 331/108 |
| 5,629,651 | 5/1997 | Mizuno | 331/57 X |
| 5,635,875 | 6/1997 | Kusakabe | 331/1 A |

Primary Examiner—David Mis
Attorney, Agent, or Firm—Schmeiser, Olsen & Watts; Eugene T. Shkurko

[57] ABSTRACT

According to the preferred embodiment of the present invention, a phase-locked loop is provided that overcomes the limitations of the prior art by facilitating fast locking on transition to a different output frequency. The phase-locked loop comprises an oscillator that provides a phase-locked loop output signal at various selected frequencies; a feedback divider; a phase comparator; a memory storage mechanism for storing phase-locked loop control information corresponding to selected output frequencies; and a digital circuit mechanism that receives the control information from the memory storage mechanism on transition to a different output frequency. The control information includes a digital counter value corresponding to the last recorded phase difference of the output signal at the different output frequency. On transition, this information is loaded directly to the digital circuit mechanism, reducing the need and time required for the phase comparator operation to drive the PLL to lock. Thus, the phase-locked loop can quickly achieve phase lock at the different operating frequency.

4 Claims, 2 Drawing Sheets

FAST LOCKING VARIABLE FREQUENCY PHASE-LOCKED LOOP

BACKGROUND OF THE INVENTION

1. Technical Field

This invention generally relates to semiconductor devices, and more specifically relates to phase-locked loops.

2. Background Art

Phase-locked loops (PLLs) are used a wide variety of applications in semiconductor devices. For example, PLLs are used in clock generators, frequency multipliers, frequency synthesizers and servo systems in disk drives. Naturally, in all of these and other applications the accuracy and reliability of the PLL is of critical importance.

Turning to FIG. 1, FIG. 1 is a schematic view of a prior-art phase-locked loop 100. PLL 100 comprises a phase comparator 102, a charge pump 104, a filter 106, a voltage-controlled oscillator (VCO) 110, and a feedback divider 114.

The general operation of PLL's is well known, so only a brief explanation will be given. Phase comparator 102 compares an input signal to a feedback signal from feedback divider 114. Depending upon the phase difference between the input signal and feedback signal, the phase comparator drives charge pump 104. The output of charge pump 104 is filtered by filter 106, and is used to drive the VCO 110. The VCO 110 comprises a voltage-to-current converter and a current controlled oscillator. Thus, the VCO 110 receives a voltage and at its input and outputs a signal with a frequency proportional to that signal. Of course, those skilled in the art will recognize that this description of the VCO 110 is essentially arbitrary and that the VCO 110 could be illustrated as separate voltage-to-current convertor and current-controlled oscillator rather than as a single element.

The output of VCO 110 fed back through feedback divider 114 to phase comparator 102. The feedback divider 114 divides down the output signal frequency to match the input signal frequency so they can be phase compared. Thus, the signal path through the feedback divider to the phase compare 102 creates the feedback that facilitates the phase-locked loop operation.

Several PLL applications require the ability to be able to switch the PLL output frequency during operation. The frequency at which the phase-locked loop 100 operates is dependent upon the frequency of the VCO 110 and the amount of division by the feedback divider 114. To change the output frequency, these elements must be adjusted. Unfortunately, adjusting these elements while the PLL is running causes the phase lock to be lost until the PLL locks again. This delay in locking can be unacceptable for applications that require a quick phase lock at the new frequency.

Therefore, there existed a need to provide an improved PLL that can switch from one output frequency to another and quickly reach phase lock.

DISCLOSURE OF INVENTION

According to the present invention, a phase-locked loop is provided that overcomes the limitations of the prior art by facilitating fast locking on transition to a different output frequency. The phase-locked loop comprises an oscillator that provides a phase-locked loop output signal at various selected frequencies; a feedback divider; a phase comparator; a memory storage mechanism for storing phase-locked loop control information corresponding to selected output frequencies; and a digital circuit mechanism that receives the control information from the memory storage mechanism on transition to a different output frequency. The control information includes a digital counter value corresponding to the last recorded phase difference of output signal at the different output frequency. On transition, this information is loaded directly to the digital circuit mechanism, reducing the need and time required for the phase comparator operation to drive the PLL to lock. Thus, the phase-locked loop can quickly achieve phase lock at the different operating frequency.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
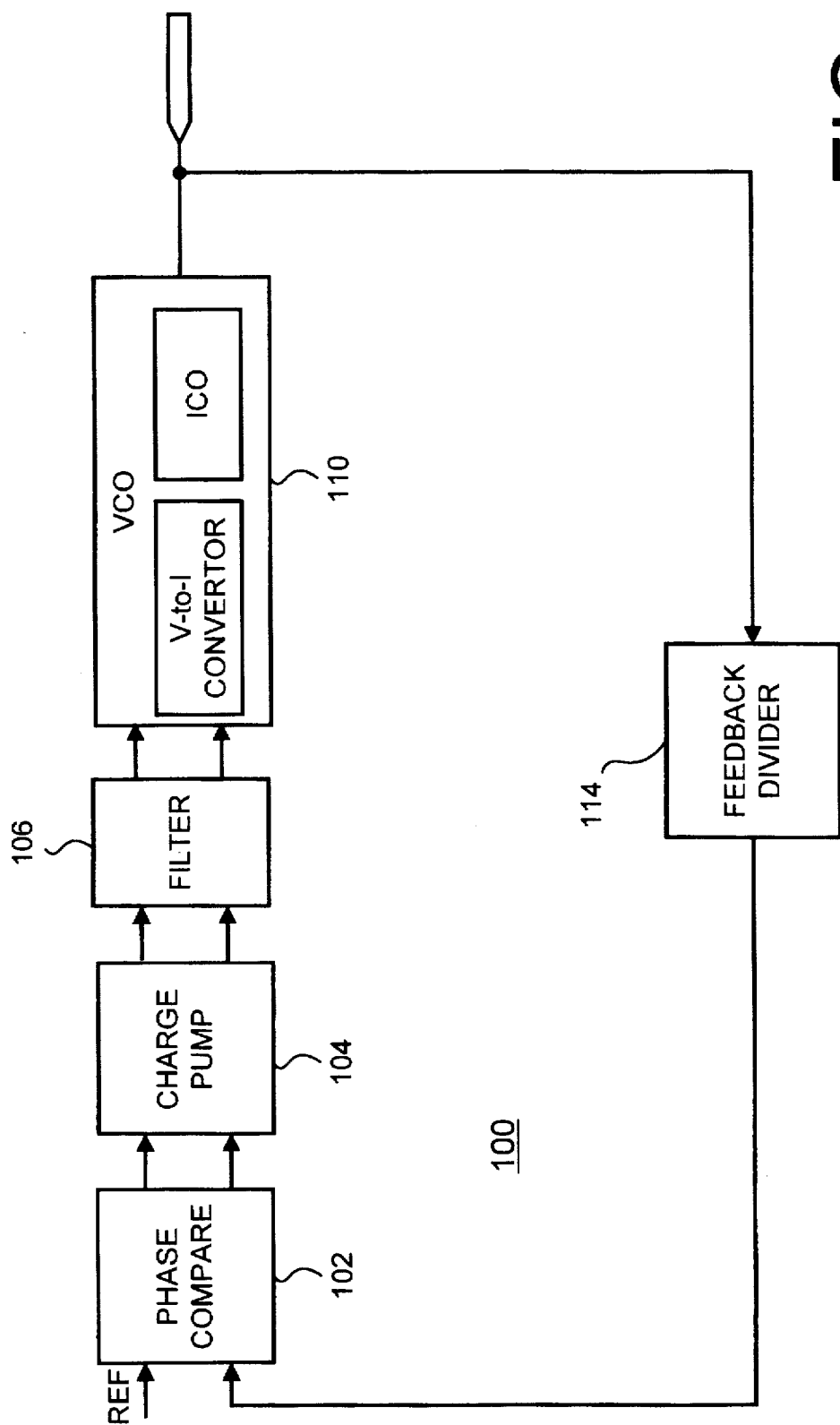
FIG. 1 is a schematic view of a prior art phase-locked loop device.
Figure 2:
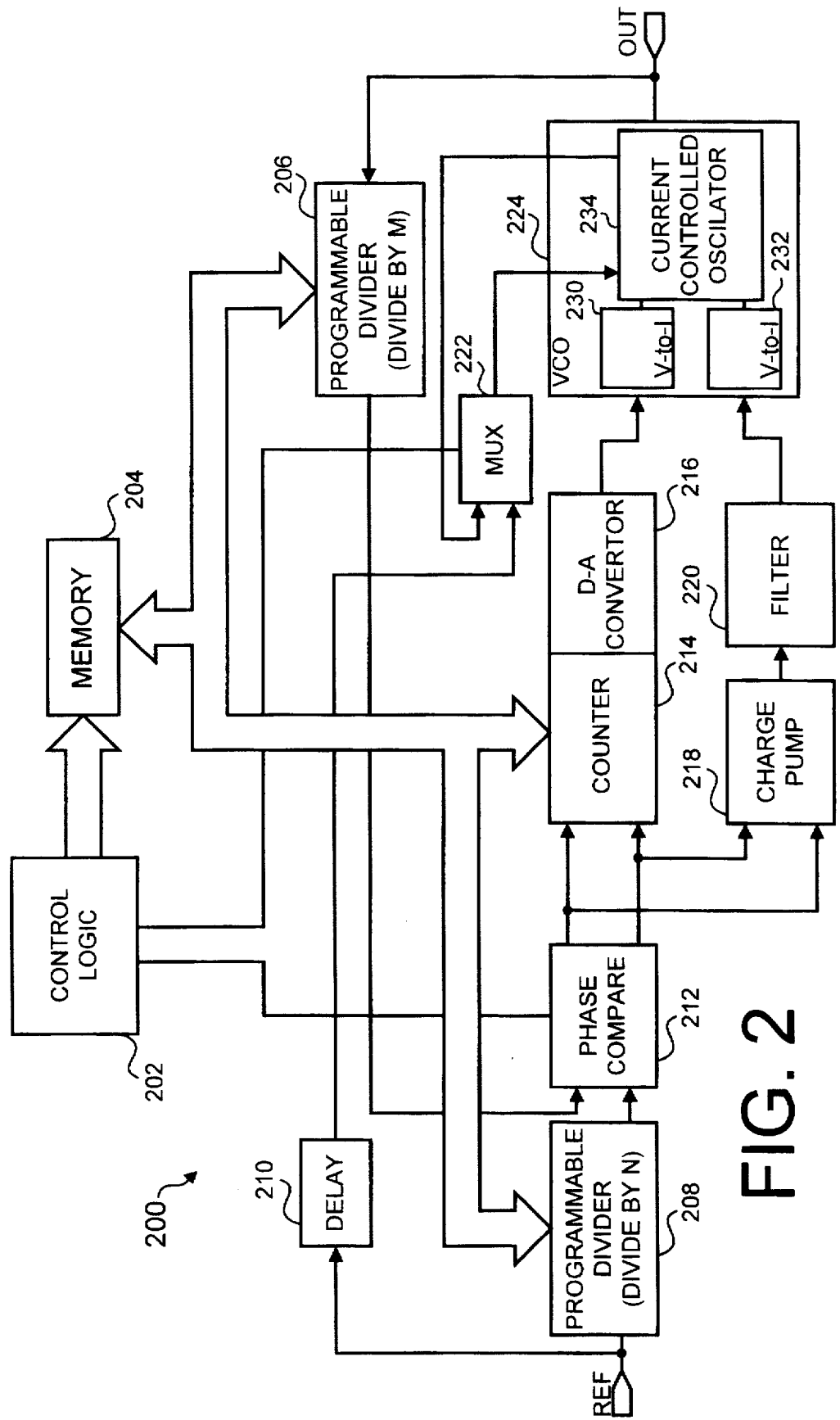
FIG. 2 is a schematic view of a phase-locked loop device in accordance with the preferred embodiment.

A phase-locked loop (PLL) in accordance with the present invention overcomes the limitations of the prior art by providing a way to change the output frequency of the PLL and achieve lock at the new frequency much faster than was previously possible. Referring to FIG. 2, a programmable PLL 200 in accordance with the preferred embodiment is illustrated schematically. The PLL 200 comprises control logic 202, memory storage 204, a programmable feedback divider 206, a programmable reference divider 208, a delay element 210, a phase comparator 212, a digital counter 214, a digital-to-analog convertor 216, a charge pump 218, a filter 220, a multiplexer 222 and a voltage controlled oscillator (VCO) 224.

The PLL 200 has many of the same operating characteristics as prior art PLLs but also provides significant advantages. For example, the output frequency is selectably changeable by use of programmable feedback divider 206 in the feedback loop and programmable reference divider 208 at the PLL input. However, the PLL 200 has the advantage of facilitating a fast lock at the new output frequency. Programmable feedback divider 206 divides the output frequency by a selectable number M and outputs a feedback signal. Programmable reference divider 208 divides the reference signal frequency by a selectable number N and outputs a modified reference signal. The output frequency of the PLL 200 is equal to the reference frequency times the ratio of M to N. Thus, by selecting a combination of M and N the output of the PLL 200 can be set to the desired frequency.

The control logic 202 controls the process of changing the operation frequency of the PLL 200, and comprises the necessary control circuits to control the flow of data between the memory system 204 and the various elements of the PLL. The memory system 204 can comprise any type of memory storage system, but preferably comprises a random access memory (RAM) or a combination RAM and read only memory (ROM). The memory system 204 stores the data used by PLL 200 to facilitate operation at different output frequencies. In particular, the memory system 204 preferably stores the control information data necessary to control programmable dividers 206 and 208 such that M and N can be properly determined for each desired output frequency. Thus, control logic 202 changes the PLL 200 output frequency by directing the proper programmable divider parameters be downloaded to programmable dividers 206 and 208 such that M and N are selected to achieve the desired frequency. Additionally, it is preferable to initiate a frequency change in synchronism with the inputs to the phase detector.

Of course, this is just one way of illustrating control logic 202 and memory system 204. The memory system 204 could reside anywhere, including on the controlled devices themselves (e.g., feedback divider 206 and digital counter 214). For example, each controlled device could have storage locations corresponding to eight different frequencies with the switching controlled by control logic 202. Thus, in accordance with the preferred embodiment, any memory system could be used that is able to store the required control information for each component at corresponding to a plurality of frequencies.

The VCO 224 preferably comprises at least one voltage-to-current (V-to-I) converter (e.g., 230, 232) and a current controlled oscillator 234. The current controlled oscillator 234 is preferably a ring oscillator with a controlled bias. The V-to-I convertors 230 and 232 receive voltage signal inputs from DAC 216 and filter 220, respectively, and converts them to current signals. These current signals are summed together to control the current controlled oscillator bias.

Of course this is just one illustrative embodiment, and other embodiments are equally within the scope of the present invention. For example, the output of the filter 220 could drive a current directly into the current controlled oscillator with only the DAC 216 inputted into a V-to-I convertor. Likewise, VCO 224 could easily be replaced without completely separate V-to-I convertors and current controlled oscillators.

The PLL 200 facilitates fast locking at a new selected frequency by use of a digital circuit mechanism. The digital circuit mechanism preferably includes a programmable counter 214 in series with a DAC 216. In the preferred embodiment the counter 214 and DAC 216 together serve as a digital filter for the PLL 200 in parallel with a standard analog charge pump 218 and filter 220. The counter 214 receives a phase difference signal in the form of up/down signals from the phase detector 212 and outputs a digital signal to DAC 216 proportional to the counted number of signals. The DAC 216 converts the digital signal received from the counter 214 to an analog form and transmits it to the VCO 224 input.

The charge pump 218 and filter 220 are used in parallel with the counter 214 and DAC 216 to provide a fast path for jitter reduction and to compensate for errors that might accrue in the value of the digital portion as a function of changing operating conditions. In effect, the charge pump 218 and filter 220 provide an analog means of compensating for insufficient resolution in the digital counter 214. Thus, charge pump 218 and filter 200 provide increased resolution and allow the use of a counter 218 and DAC 220 with fewer bits. However, because the counter 214 and DAC 216 provide the majority of the control current for the VCO 224, the filter 220 needs only have a frequency range equal to a couple of bits on the DAC output.

In an alternative embodiment, the charge pump 218 and filter 220 may be dispensed with altogether. This embodiment is possible where the counter 214 has sufficient resolution to accurately control VCO 224. Thus, where a counter 214 and DAC 216 are chosen with sufficient bits the charge pump 218 and filter 200 can be dispensed with completely.

The counter 214 operates as follows: when the PLL 200 is set to a particular frequency for the first time, the RAM delivers the required divider parameters to programmable dividers 206 and 208 and the counter 214 is set to zero. The phase comparator 212 detects any phase difference between the reference input signal and the output signal, and provides a series of up or down signals to the counter 214 until the phase difference is eliminated. The counter then stays substantially at this value as long as the PLL operates with this output frequency, although phase comparator 212 may adjust counter 214 during operation if factors cause the phase to change.

Before the PLL 200 is set to a new frequency, the counter value for the previous frequency is stored in the memory storage 204. If and when the PLL returns to this output frequency, the stored counter value will be delivered from the memory storage 204 to the counter 214 as the divider parameters are delivered to programmable divider 206 and 208. This eliminates the need for the phase comparator 212 to push the counter 214 all the way to the correct output phase, and thus the PLL locks quickly in phase.

Additionally, it is preferable that control logic 202 resets the phase comparator 212 to initialize it to a state corresponding to the phase-locked condition of the PLL each time the frequency is changed. This is especially true for phase comparators that use complex sequential logic.

In a typical current controlled ring oscillator, the output of the oscillator is fed back in to the oscillator along an internal feedback path. This internal feedback path or "ring" provides the negative feedback that forces oscillation. Hence, these oscillators are commonly referred to as a "ring oscillators." In the preferred embodiment a switching mechanism, preferably a multiplexer 222, is inserted into the ring oscillator feedback path. The other input to the multiplexer 222 receives the PLL reference signal through delay element 210. In normal operation, the control logic 202 directs multiplexer 222 to gate the oscillator output back into the oscillator. Thus, the current controlled oscillator operates normally with a typical ring oscillator feedback path.

When the PLL 200 switches frequency, the control logic 210 directs multiplexer 222 to pass the PLL reference signal directly into the current controlled oscillator. This forces a fast approximation of the input phase to the PLL output. In particular, the delay element 210 is added so that a known phase with respect to the PLL input signal can be forced onto the VCO 224 during the first cycle of operation after switching output frequencies. The normal VCO 224 internal feedback loop is inhibited and the delayed input edge forced into the VCO at a time that corresponds to the desired output phase. The amount of delay provided by delay 210 can be determined in the design phase and hard wired or dynamically determined during operation by means of a separate feedback loop. This separate feedback loop would have a separate phase comparator to sense the phase difference between the multiplex inputs during normal operation, causing the delay to be adjusted until the phase difference is zero.

Thus, during operation the VCO behaves as a normal ring oscillator. However, when the PLL switches frequencies, the multiplexer 222 is switched by the control logic 202 to take a reference input edge and force the edge to start through the ring at a particular time. This sets the phase of the VCO instantly at that point. Thus, a fast phase lock is provided that facilitates quick switching of PLL output frequencies.

Thus, a PLL is provided that can dynamically switch from one output frequency to another. Furthermore, the PLL achieves a fast lock when switching from one frequency to another. This fast lock is facilitated by the use of the programmable counter 214 and the multiplexer 222 inserted into the current controlled oscillator internal feedback path. While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductors, as is understood in the art.

We claim:

1. A phase-locked loop capable of quickly switching between a plurality of selected output frequencies comprising:

a) an oscillator for providing a phase-locked loop output signal at said selected frequencies said oscillator comprising a ring oscillator having an internal feedback path;

b) a feedback divider, said feedback divider receiving said phase-locked loop output signal and providing a feedback signal having a frequency proportional to said output signal frequency;

c) a phase comparator for detecting a phase difference between said feedback signal and a reference signal and providing a phase difference signal in response to said detected phase difference;

d) a memory mechanism for storing phase-locked loop control information corresponding to said selected output frequencies said control information including a stored counter value for said selected output frequencies;

e) a counter mechanism said counter mechanism receiving said stored counter value from said memory mechanism and said phase difference signal from said phase comparator said counter mechanism counting pulses of said phase difference signal and outputting a counter value adjusted proportional to said counted pulses;

f) a digital-to-analog converter said digital-to-analog converter receiving said adjusted counter value and providing a control signal proportional to said adjusted counter value to said oscillator said control signal determining the oscillation frequency of said oscillator;

g) a switching mechanism inserted into said ring oscillator feedback path, said switching mechanism receiving said reference signal such that said reference signal is switched into said ring oscillator on transition to one of said selected output frequencies; and h) a delay element inserted between said switching mechanism and said reference signal such that said switching mechanism switches a delayed reference signal into said ring oscillator.

2. A phase-locked loop capable of quickly switching between a plurality of selected output frequencies comprising:

a) an oscillator for providing a phase-locked loop output signal at said selected frequencies;

b) a feedback divider, said feedback divider receiving said phase-locked loop output signal and providing a feedback signal having a frequency proportional to said output signal frequency;

c) a phase comparator for detecting a phase difference between said feedback signal and a reference signal and providing a phase difference signal in response to said detected phase difference;

d) a memory mechanism for storing phase-locked loop control information corresponding to said selected output frequencies, said control information including a stored counter value for said selected output frequencies;

e) a counter mechanism said counter mechanism receiving said stored counter value from said memory mechanism and said phase difference signal from said phase comparator, said counter mechanism counting pulses of said phase difference signal and outputting a counter value adjusted proportional to said counted pulses;

f) a digital-to-analog converter, said digital-to-analog converter receiving said adjusted counter value and providing a control signal proportional to said adjusted counter value to said oscillator, said control signal determining the oscillation frequency of said oscillator; and g) a charge pump and a filter, said charge pump receiving said phase difference signal in parallel with said counter mechanism and said digital-to-analog converter, said filter connected to an output of said charge pump and inputting a second output control signal to said oscillator.

3. A programmable phase-locked loop capable of quickly switching between a plurality of preselected output frequencies comprising:

a) a voltage controlled oscillator for providing a phase-locked loop output signal at said preselected frequencies, said voltage controlled oscillator comprising a ring oscillator having feedback path;

b) a memory mechanism for storing feedback divider control information, reference divider control information, and stored counter values corresponding to said preselected output frequencies;

c) a programmable feedback divider, said programmable feedback divider receiving said phase-locked loop output signal and providing a feedback signal having a frequency selectably proportional to the output frequency;

d) a programmable reference divider, said programmable reference divider receiving a reference signal and providing a modified reference signal having a frequency selectably proportional to the reference signal frequency;

e) a phase comparator for detecting a phase difference between said modified reference signal and said feedback signal and providing a phase difference signal in response to said phase difference;

f) a digital counter mechanism said digital counter mechanism receiving said stored counter value from said memory mechanism and said phase difference signal from said phase comparator, said digital counter mechanism counting pulses of said phase difference signal and outputting a counter value adjusted proportional to said counted pulses;

g) a digital-to-analog converter, said digital-to-analog converter receiving said adjusted counter value and providing a control signal proportional to said adjusted counter value to said oscillator said control signal determining the oscillation frequency of said oscillator, wherein to facilitate transition to one of said preselected output frequencies said programmable feedback divider receives said feedback divider control information and said programmable reference divider receives said reference divider control information and said digital counter mechanism receives said stored value corresponding to said one of said preselected output frequencies, and wherein said stored value causes said digital counter mechanism to drive said digital-to-analog converter to provide a control signal such that said oscillation frequency is near said one of said preselected output frequencies, and wherein said phase comparator then provides said phase difference signal to said digital counter mechanism to adjust said counter value and to further drive said digital-to-analog converter to provide a control signal such that said oscillation frequency is driven to said one of said preselected output frequencies, and wherein said adjusted counter value is saved at said memory mechanism;

h) a switching mechanism inserted into said ring oscillator feedback path, said switching mechanism receiving said reference signal such that said reference signal is switched into said ring oscillator on transition to said one of said preselected output frequencies; and i) a delay element inserted between said switching mechanism and said reference signal such that switching mechanism switches a delayed reference signal into said ring oscillator.

4. A programmable phase-locked loop capable of quickly switching between a plurality of preselected output frequencies comprising:

a) a voltage controlled oscillator for providing a phase-locked loop output signal at said preselected frequencies, said voltage controlled oscillator comprising a ring oscillator having feedback path;

b) a memory mechanism for storing feedback divider control information, reference divider control information and stored counter values corresponding to said preselected output frequencies;

c) a programmable feedback divider, said programmable feedback divider receiving said phase-locked loop output signal and providing a feedback signal having a frequency selectably proportional to the output frequency;

d) a programmable reference divider, said programmable reference divider receiving a reference signal and providing a modified reference signal having a frequency selectable proportional to the reference signal frequency;

e) a phase comparator for detecting a phase difference between said modified reference signal and said feedback signal and providing a phase difference signal in response to said phase difference;

f) a digital counter mechanism, said digital counter mechanism receiving said stored counter value from said memory mechanism and said phase difference signal from said phase comparator, said digital counter mechanism counting pulses of said phase difference signal and outputting a counter value adjusted proportional to said counted pulses;

g) a digital-to-analog converter, said digital-to-analog converter receiving said adjusted counter value and providing an control signal proportional to said adjusted counter value to said oscillator, said control signal determining the oscillation frequency of said oscillator, wherein to facilitate transition to one of said preselected output frequencies said programmable feedback divider receives said feedback divider control information and said programmable reference divider receives said reference divider control information and said digital counter mechanism receives said stored value corresponding to said one of said preselected output frequencies, and wherein said stored value causes said digital counter mechanism to drive said digital-to-analog converter to provide a control signal such that said oscillation frequency is near said one of said preselected output frequencies, and wherein said phase comparator then provides said difference signal to said digital counter mechanism to adjust said counter value and to further drive said digital-to-analog converter to provide a control signal such that said oscillation frequency is driven to said one of said preselected output frequencies, and wherein said adjusted counter value is saved at said memory mechanism;

h) a switching mechanism inserted into said ring oscillator feedback path, said switching mechanism receiving said reference signal such that said reference signal is switched into said ring oscillator on transition to said one of said preselected output frequencies; and i) a charge pump and a filter, said charge pump receiving said phase difference signal in parallel with said digital counter mechanism, said filter connected to an output of said charge pump and inputting a second output control signal to said voltage controlled oscillator.

* * * * *

UNITED STATES PATENT AND TRADEMARK OFFICE
CERTIFICATE OF CORRECTION

PATENT NO. : 5,757,238
DATED : May 26, 1998
INVENTOR(S) : Ferraiolo et al.

It is certified that error appears in the above-identified patent and that said Letters Patent is hereby corrected as shown below:

In column 4 at line 32, the words "in to" should read --into--.
In column 5 at line 21, the text "frequencies said" should read --frequencies, said--.
In column 5 at line 38, the text "mechanism said" should read --mechanism, said--.
In column 5 at line 41, the text "comparator said" should read --comparator, said--.
In column 5 at line 44, the text "converter said" should read --converter, said--.
In column 5 at line 47, the text "oscillator said" should read --oscillator, said--.
In column 6 at line 10, the text "mechanism said" should read --mechanism, said--.
In column 6 at line 55, the text "mechanism said" should read --mechanism, said--.
In column 6 at line 65, the text "oscillator said" should read --oscillator, said--.
In column 7 at line 37-38, the text "informa-tion and" should read --informa-tion, and--.
In column 7 at line 48, the word "selectable" should read --selectably--.

Signed and Sealed this

Twenty-fifth Day of August, 1998

Attest:

BRUCE LEHMAN

Attesting Officer

Commissioner of Patents and Trademarks